(12) United States Patent
Kim

(10) Patent No.: US 11,557,622 B2
(45) Date of Patent: Jan. 17, 2023

(54) IMAGE SENSING DEVICE

(71) Applicant: SK hynix Inc., Gyeonggi-do (KR)

(72) Inventor: Won Jin Kim, Chungcheongbuk-do (KR)

(73) Assignee: SK HYNIX INC.

( * ) Notice: Subject to any disclaimer, the term of this patent is extended or adjusted under 35 U.S.C. 154(b) by 118 days.

(21) Appl. No.: 16/784,019

(22) Filed: Feb. 6, 2020

(65) Prior Publication Data

US 2021/0066374 A1 Mar. 4, 2021

(30) Foreign Application Priority Data

Aug. 28, 2019 (KR) .......................... 10-2019-0106001

(51) Int. Cl.
*H01L 27/14* (2006.01)
*H01L 27/146* (2006.01)

(52) U.S. Cl.
CPC .... *H01L 27/14627* (2013.01); *H01L 27/1463* (2013.01); *H01L 27/14621* (2013.01); *H01L 27/14645* (2013.01)

(58) Field of Classification Search
None
See application file for complete search history.

(56) References Cited

U.S. PATENT DOCUMENTS

| 9,276,029 | B1 | 3/2016 | Lu et al. | |
| 9,360,607 | B1 | 6/2016 | Tai et al. | |
| 9,704,902 | B2 | 7/2017 | Kusaka | |
| 10,236,315 | B2 * | 3/2019 | Ooka | H01L 27/14629 |
| 11,211,420 | B2 * | 12/2021 | Lee | H01L 27/1463 |
| 11,245,823 | B2 * | 2/2022 | Chen | G02B 3/0056 |
| 2011/0298074 | A1 * | 12/2011 | Funao | H01L 27/14605 257/432 |
| 2017/0047367 | A1 * | 2/2017 | Lee | H01L 27/14621 |

* cited by examiner

*Primary Examiner* — Ali Naraghi
(74) *Attorney, Agent, or Firm* — Perkins Coie LLP

(57) ABSTRACT

An image sensing device includes a substrate layer in which an array of photoelectric conversion elements is formed, grid structures disposed over the substrate layer to divide space above the substrate into different sensing regions, each grid structure including an air layer, color filters formed to fill bottom portions of spaces between the grid structures, the color filters having a higher refractive index than the air layer, and a lens layer disposed over the grid structures and the color filters such that part of the lens layer fills top portions of the spaces between the grid structures, the lens layer having a higher refractive index than of the color filters.

14 Claims, 11 Drawing Sheets

IMAGE SENSING DEVICE

CROSS-REFERENCE TO RELATED APPLICATION

This patent document claims the priority and benefits of Korean patent application No. 10-2019-0106001, filed on Aug. 28, 2019, which is incorporated by reference in its entirety as part of the disclosure of this patent document.

TECHNICAL FIELD

The technology and implementations disclosed in this patent document relate to an image sensing device.

BACKGROUND

An image sensing device is a semiconductor device for converting an optical image into electrical signals. With the development of automotive, medical, computer, and communication industries, the demand for high-performance image sensors is increasing in various devices such as digital cameras, camcorders, personal communication systems (PCSs), game consoles, surveillance cameras, medical micro-cameras, robots, etc.

SUMMARY

The embodiments of the disclosed technology, among other features and benefits, relate to an image sensing device that can reduce crosstalk between neighboring imaging pixels by improving structural characteristics of a light transmission layer in a pixel array.

In accordance with an embodiment of the disclosed technology, an image sensing device is provided to include a substrate layer in which an array of photoelectric conversion elements is formed, grid structures disposed over the substrate layer to divide space above the substrate into different sensing regions, each grid structure including an air layer, color filters to fill bottom portions of spaces between the grid structures, the color filters having a higher refractive index than the air layer, and a lens layer disposed over the grid structures and the color filters such that part of the lens layer fills top portions of the spaces between the grid structures, the lens layer having a higher refractive index than the color filters.

In another aspect, an image sensing device is provided to include a substrate layer in which an array of photoelectric conversion elements is formed to convert incident light into electric signals; grid structures disposed over the substrate layer to divide space above the substrate into different sensing regions with each sensing region including one or more photoelectric conversion elements, each grid structure including a low-index layer; color filters formed to fill bottom portions of spaces between the grid structures, the color filters having a higher refractive index than an index of refraction of the low-index layer; and a first lens layer formed to fill top portions of the spaces between adjacent grid structures over each color filter; and a second lens layer formed over the first lens layer and the grid structures.

DETAILED DESCRIPTION

Reference will now be made in detail to certain embodiments, examples of which are illustrated in the accompanying drawings. Wherever possible, the same reference numbers will be used throughout the drawings to refer to the same or similar parts.

Figure 1:
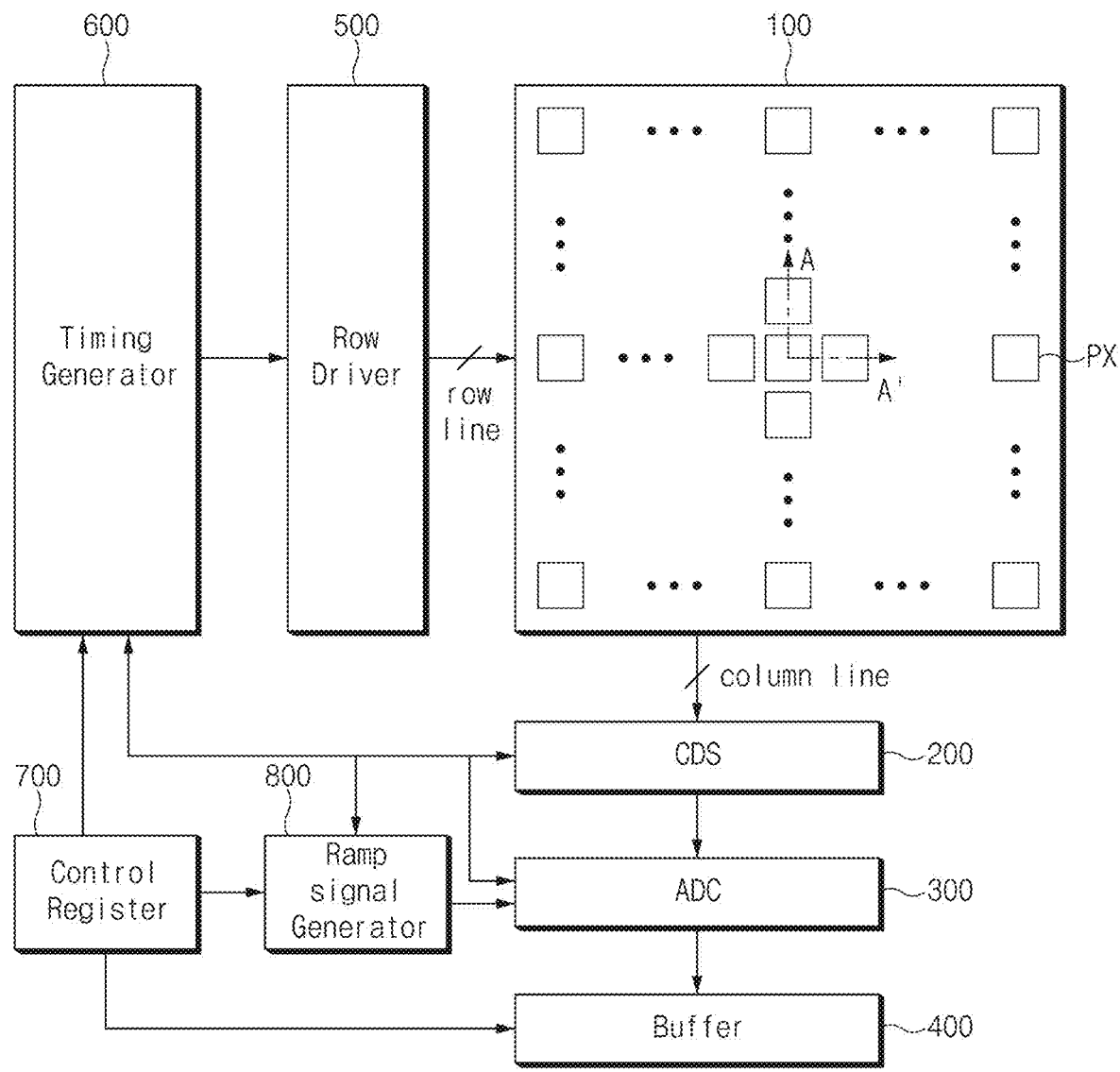
FIG. 1 is an example of a block diagram illustrating an image sensing device based on some implementations of the disclosed technology.

FIG. 1 is an example of a block diagram illustrating an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) arranged in a two-dimensional (2D) array. In one example, the unit pixels are arranged in first and second directions perpendicular to each other. Each of the unit pixels (PXs) may include a photosensitive element to convert light incident onto the unit pixel into an electrical signal, which is called a pixel signal in this patent document, and may output the pixel signal to an electrical signal processing circuit such as the correlated double sampler (CDS) 200 through column lines. The pixel array 100 may also include row signal lines and column signal lines arranged in rows and columns of the 2D array, and the unit pixels (PXs) are coupled to the row and column signal lines.

In some implementations, the image sensing device may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. The correlated double sampler (CDS) 200 may hold and sample electrical image signals received from the pixels (PXs) of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

In some implementations, the ADC 300 may use a reference signal (e.g., ramp signal) to sample an input signal (e.g., pixel signal) multiple times using the reference signal and analog-to-digital convert the sampled input signals by counting the number of clock pulses until crossing points. For example, the ADC 300 may count clock pulses during a period of time when the input signal is above the reference signal and stop counting clock pulses upon detection of a crossing point (crossing of the reference signal and the input signal).

In some implementations, the analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count the number of crossing points of the ramp signal and the sampling signal based on a clock signal received from the timing generator 600, and may generate a counter output indicating the number of crossing points.

The buffer 400 may store the digital signals received from the analog-to-digital converter (ADC) 300. The buffer 400 may also sense and amplify each of the digital signals to output each of the amplified digital signals. Therefore, the buffer 400 may include a memory (not shown) and an amplifier circuit such as a sense amplifier (not shown). The memory may store the counter output, which is associated with output signals of the plurality of unit pixels (PXs). The sense amplifier may sense and amplify electrical signals received from the memory.

The row driver 500 may drive the pixel array 100 on a row line basis in response to an output signal of the timing generator 600. For example, the row driver 500 may generate a selection signal to select any one of the plurality of row lines.

The timing generator 600 may generate timing signals to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate ramp signals that will be compared with electrical signals (e.g., the sampling signal discussed above) generated by pixels in response to control signals received from the timing generator 600.

Figure 2:
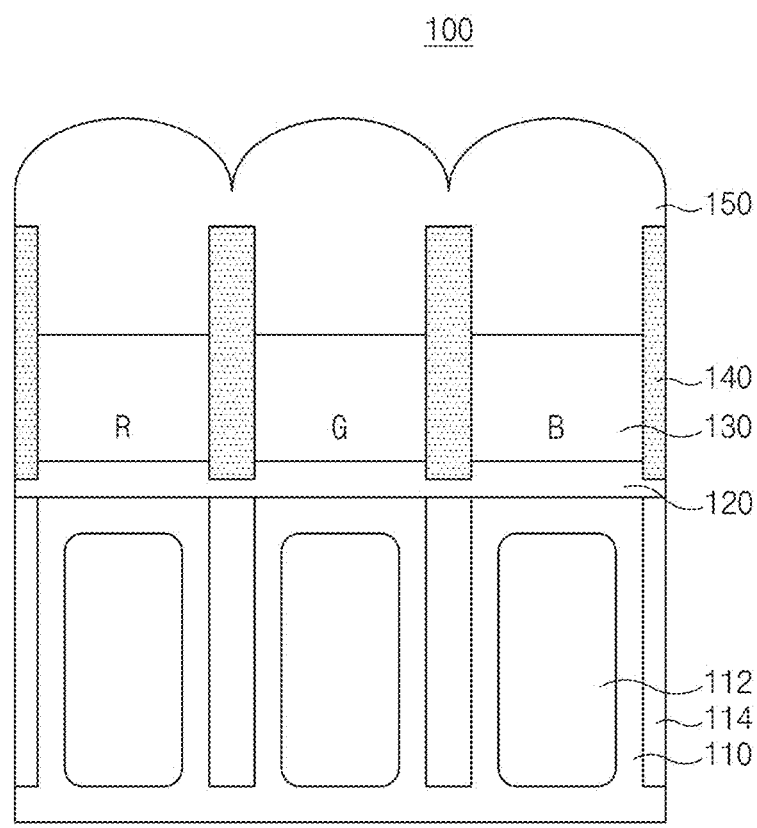
FIG. 2 is an example of a cross-sectional view illustrating a pixel array taken along the line A-A' shown in FIG. 1.

FIG. 2 is an example of a cross-sectional view illustrating the pixel array 100 taken along the line A-A' shown in FIG. 1.

The pixel array 100 of the image sensing device may include a substrate layer 110, a buffer layer 120, at least one color filter layer 130, a grid structure 140, and a lens layer 150.

The substrate layer 110 may include a semiconductor substrate made of a suitable semiconductor material. In some implementations, the semiconductor substrate 110 may include a monocrystalline silicon or a similar material. The semiconductor substrate 110 may include P-type impurities at least in some areas. In the substrate layer 110, a number of photoelectric conversion elements 112 are formed such that a device isolation film 114 isolates each photoelectric conversion element 112 from adjoining photoelectric conversion elements 112.

Each of the photoelectric conversion elements 112 may include an organic or inorganic photodiode. In some implementations, the photoelectric conversion element 112 may include two or more impurity regions vertically stacked within the substrate layer 110. For example, each of the photoelectric conversion elements 112 may include a photodiode in which an N-type impurity region and a P-type impurity region are vertically stacked. The N-type impurity region and the P-type impurity region may be formed by ion implantation. The device isolation 114 may include a deep trench isolation (DTI) structure.

The buffer layer 120 may operate as a planarization layer to provide an even surface for subsequent fabrication processes where structures formed on the substrate layer 110 have uneven surfaces. In some implementations, the buffer layer 120 is substantially transparent to light to be detected by the photoelectric conversion elements 112. In addition, the buffer layer 120 may operate as an anti-reflection film to allow incident light received through the lens layer 150 and the color filter layers 130 to pass through the photoelectric conversion elements 112 of the substrate layer 110. The buffer layer 120 may include a multilayer structure formed by stacking different material layers having different refractive indices. For example, the buffer layer 120 may include a multilayer structure formed by stacking at least one nitride film and at least one oxide film. The nitride film may include a silicon nitride film ($Si_xN_y$, where each of 'x' and 'y' is a natural number) or a silicon oxide nitride film ($Si_xO_yN_z$, where each of 'x', 'y', and 'z' is a natural number). The oxide film may include a monolayer structure formed of any one of an undoped silicate glass (USG) film and an ultra low temperature oxide (ULTO) film, or may include a multilayer structure formed by stacking the USG film and the ULTO film. In the latter case, the oxide film may be formed by extending a capping film of the grid structure 140 to a below region of each of the color filter layers 130. In one example, the oxide film of the buffer layer 120 may be formed when the capping film of the grid structure 140 is formed.

The color filter layer 130 may include optical filters located above the photoelectric conversion elements 112 to filter the light to be detected by the photoelectric conversion elements 112. In some implementations, the color filter layer 130 may transmit visible light at a certain wavelength while blocking light at other wavelengths. The color filter layer 130 may include a plurality of color filters. Each unit pixel (PX) includes at least on color filter, and the color filters may be formed to fill the lower parts of the gaps between the grid structures 140. The color filter layer 130 may include a plurality of red color filters (Rs), a plurality of green color filters (Gs), and a plurality of blue color filters (Bs). Each red color filter (R) may transmit only red light from among RGB lights of visible light. Each green color filter (G) may transmit only green light from among RGB lights of visible light. Each blue color filter (B) may transmit only blue light from among RGB lights of visible light. The red filters (Rs), the green filters (Gs), and the blue filters (Bs) may be arranged in a Bayer pattern shape. Alternatively, the color filter layer 130 may include a plurality of cyan filters, a plurality of yellow filters, and a plurality of magenta filters.

Each grid structure 140 may be disposed between color filters R, G, and B adjacent to one another, and may prevent optical crosstalk from occurring between the color filters R, G, and B. The grid structures 140 may be formed such that it is in contact with sidewalls of the color filters R, G, and B. In some implementations, each grid structure 140 may be formed as a hybrid structure including a metal layer, a low-index layer such as a layer of air or air layer, a support film, and a capping film. A detailed structure of the grid structure 140 will hereinafter be described in detail.

In some embodiments of the disclosed technology, each grid structure 140 based on some embodiments may protrude upward from a top surface of each of the color filter layers 130. For example, the height of each of the color filters R, G, and B may takes about ⅔ of the height of the grid structure 140.

The lens layer 150 may include a plurality of micro-lenses (and/or a plurality of on-chip lenses) disposed over the color filter layers 130 and the grid structures 140. The plurality of micro-lenses may converge incident light beams received from the outside and may direct the light to the color filter layers 130.

In some embodiments of the disclosed technology, the lens layer 150 includes a bottom portion that is formed over each color filter and between adjacent grid structures, and a top portion that is formed over the grid structures and the bottom portions of the lens layer 150.

Figure 3:
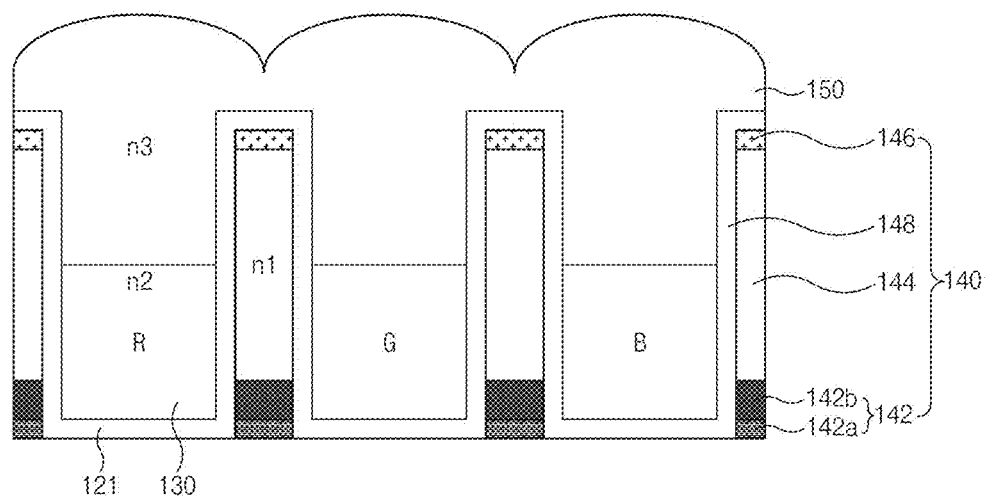
FIG. 3 is an example of a cross-sectional view illustrating a grid structure, color filter layers, and a lens layer shown in FIG. 2.

FIG. 3 is an example of a cross-sectional view illustrating the grid structure, the color filter layers, and the lens layer shown in FIG. 2.

As shown in FIG. 3, the grid structure 140 may include a metal layer 142, a low-index layer such as a layer of air or an air layer 144, a support film 146, and a capping film 148.

The metal layer 142 may include a barrier metal layer 142a and a tungsten layer 142b formed over the barrier metal layer 142a. The barrier metal layer 142a may include titanium (Ti) and/or titanium nitride (TiN), or may include a stacked structure including titanium (Ti) and titanium nitride (TiN).

In some implementations, the air layer 144 may be formed between side surfaces of the capping film 148. In some implementations, the air layer 144 may be formed over the metal layer 142, and the support film 146 may be formed over the air layer 144.

The support film 146 may be used to maintain the shape of the grid structure 140 to remain unchanged, and may prevent the capping film 148 from collapsing in a process for forming the air layer 144 in the grid structure 140. The support film 146 may include an insulation film having no light absorption characteristics. The support film 146 may include at least one of a silicon oxide nitride film ($Si_xO_yN_z$, where each of 'x', 'y', and 'z' is a natural number), a silicon oxide film ($Si_xO_y$, where each of 'x' and 'y' is a natural number), and a silicon nitride film ($Si_xN_y$, where each of 'x' and 'y' is a natural number).

The capping film 148 may include a material film formed at an outermost part of the grid structure 140 to surround or cover the metal layer 142, the air layer 144, and the support film 146. The capping film 148 may extend to a below region of the color filter layer 130. In some implementation, the capping film 121 formed below the color filter layer 130 may be used as a part of the buffer layer 120. The capping film 148 may include a multilayer structure including an oxide film. For example, the capping film 148 may include a double oxide film consisting of two oxide films or may be formed of a multilayer structure formed by stacking at least one oxide film and other material films different from the oxide film. In some embodiments of the disclosed technology, the oxide film of the capping film 148 may include an ultra low temperature oxide (ULTO) film such as a silicon oxide film ($SiO_2$). In one example, the ULTO film may include an oxide film that is formed by a low-temperature oxidation process using a chemical vapor deposition.

As discussed above, the color filter layer 130 is formed in the spaces between adjacent grid structures 140. In some embodiments of the disclosed technology, the color filter layer 130 may be formed to fill bottom portions of the spaces between adjacent grid structures 140. In some implementations, the color filter layer 130 may be formed on bottom surfaces of the spaces up to a height corresponding to about ⅔ of the height of each grid structure 140. As discussed below, in some embodiments of the disclosed technology, an upper portion of each space interposed between adjacent grid structures 140 is filled with the lens layer 150.

A refractive index (n2) of the color filter layer 130 may be higher than a refractive index (n1) of the low-index layer 144 such as a layer of air or air layer, and may be lower than a refractive index (n3) of the lens layer 150 (i.e., n1<n2<n3). For example, the refractive index (n2) of the color filter layer 130 may be higher than 1 and identical to or lower than 1.6. In other words, the refractive index of the color filter layer 130 may be higher than the refractive index (n1=1) of the air layer 144 occupying most parts of the grid structure 140.

The lens layer 150 may be formed over the color filter layer 130 and the grid structure 140 in a manner that the lens layer 150 is formed in a gap between adjacent grid structures 140. In one example, a lower portion of the lens layer 150 may be formed between the low-index layers 144 (e.g., a layer of air) of the grid structures 140.

Specifically, the lens layer 150 may be formed of a specific material having a refractive index (n3) that is higher than the refractive index (n2) of the color filter layer 130. For example, the lens layer 150 may include a specific material having a refractive index (n3) higher than 1.6.

As described above, the lens layer 150 having a refractive index that is higher than the refractive index of the color filter layer 130 may be formed such that a bottom portion of the lens layer 150 is formed between the air layers 144 of the grid structures 140. The bottom portion of the lens layer 150 can be structured to increase the amount of light that passes the color filter layer 130 and is focused onto the photoelectric conversion elements 112. In some implementations, all or a significant portion of the incident light may be reflected without penetrating the air layers 144 and all or a significant portion of the reflected incident lights may be collected in the photoelectric conversion elements 112.

According to the Snell's law, as light passes the border between media, depending upon the relative refractive indices of the two media, the light will either be refracted to a lesser angle, or a greater one. Therefore, total reflection can occur when light travels from a first material layer to a second material layer where the first material layer has an index of refraction larger than the second material layer.

Generally, while the refractive index of the color filter layer is higher than the refractive index of the air layer, the refractive index of the color filter layer is not large enough for total reflection. Therefore, light beams that pass through the color filters reach the air grids, some of them may pass through the air grids, reaching adjacent pixels.

In some embodiments of the disclosed technology, the lens layer 150 may be formed of a material having a higher refractive index than the color filter layer 130, and some parts of the lens layer 150 may be disposed between the grid structures 140. Therefore, light beams that propagate toward the grid structures 140 through the lens layer 150 having a high refractive index can be reflected toward a desired pixel while preventing the light from reaching undesired neighboring pixels.

Figure 4:
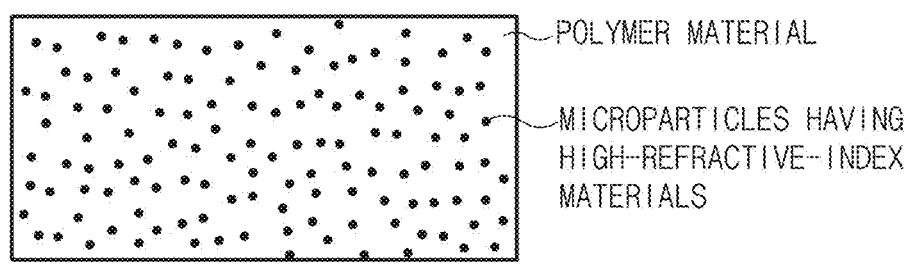
FIG. 4 is an example of a structural view illustrating constituent materials of a lens layer based on some implementations of the disclosed technology.

FIG. 4 illustrates an example of the lens layer 150 based on some implementations of the disclosed technology. In some embodiments, the lens layer 150 may include polyimide-based resin in which microparticles (e.g., nanoparticles) having high-refractive-index are evenly dispersed in a polymer layer. Alternatively, the lens layer 150 may include a material layer formed of a mixture of high-refractive-index material particles and a resin.

In some embodiments of the disclosed technology, the high-refractive-index material may include at least one of high-refractive-index metal oxide materials such as titanium oxide ($TiO_2$), tantalum oxide ($TaO_2$, $Ta_2O_5$), zirconium oxide ($ZrO_2$), zinc oxide (ZnO), tin oxide (SnO), aluminum oxide ($Al_2O_3$), lanthanum oxide ($La_2O_3$), cesium oxide ($CeO_2$), and yttrium oxide ($Y_2O_3$).

FIGS. 5A to 5F are examples of cross-sectional views illustrating processes for forming the structure of FIG. 3.

Figure 5A:
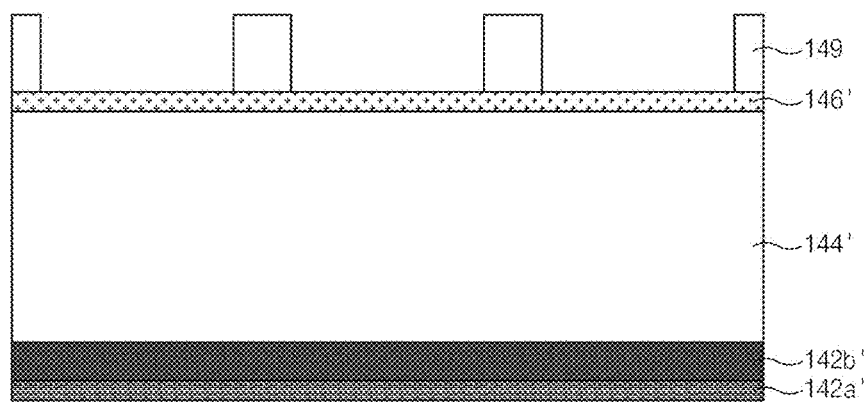
FIGS. 5A to 5F are examples of cross-sectional views illustrating processes for forming the structure of FIG. 3.

Referring to FIG. 5A, a barrier metal layer 142a', a metal film 142b', a sacrificial film 144', and a support material layer 146' may be sequentially formed over the substrate layer 110 in which the photoelectric conversion elements 112 are formed.

In some embodiments of the disclosed technology, the barrier metal material 142a' may include titanium (Ti) and/or titanium nitride (TiN), or may include a stacked structure including titanium (Ti) and titanium nitride (TiN). The metal layer 142b' may include tungsten (W). The sacrificial film 148 may include a carbon-containing spin on carbon (SOC) film. The support material layer 146' may include at least one of a silicon oxide nitride film ($Si_xO_yN_z$, where each of 'x', 'y', and 'z' is a natural number), a silicon oxide film ($Si_xO_y$, where each of 'x' and 'y' is a natural number), and a silicon nitride film ($Si_xN_y$, where each of 'x' and 'y' is a natural number).

Subsequently, a mask pattern 149 for defining the grid region may be formed over the support material layer 146'.

Figure 5B:
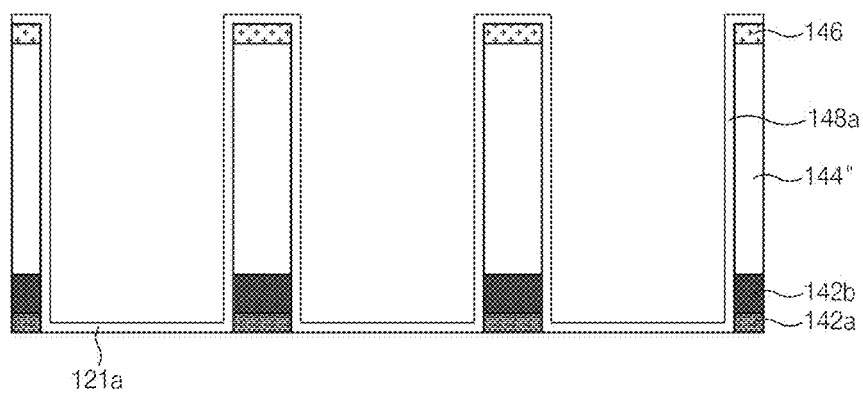

Referring to FIG. 5B, a stacked structure of a barrier metal layer 142a, a metal layer 142, a sacrificial film pattern 144", and a support film 146 may be formed using the mask pattern 149 as an etch mask.

Subsequently, first capping films 148a and 121a may be formed over the stacked structure and the substrate layer 110.

Each of the first capping films 148a and 121a may include an oxide film such as an ULTO film. In addition, each of the first capping films 148a and 121a may have a thickness such that molecules formed by combining gas to be used in a subsequent plasma process with carbon of the sacrificial film pattern 144" can be easily discharged outside.

Figure 5C:
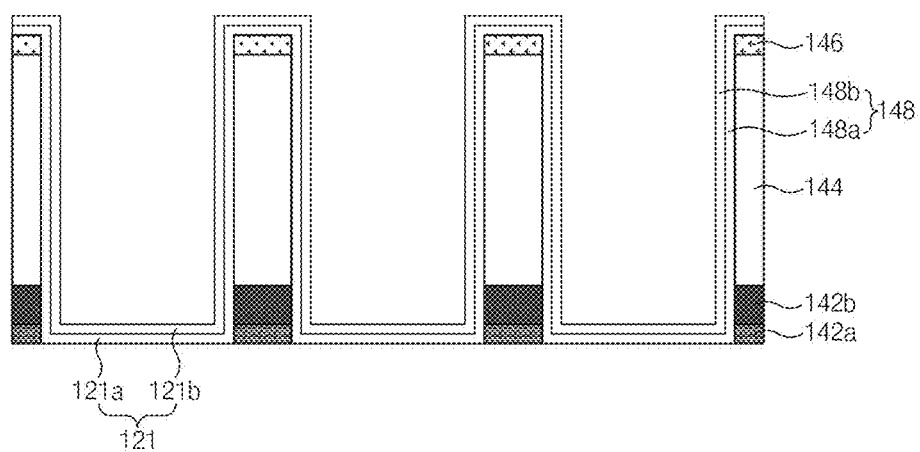

Referring to FIG. 5C, after forming the structure illustrated in FIG. 5B, a plasma process may be carried out such that the sacrificial film pattern 144" may be removed and the air layer 144 may be formed at the position from which the sacrificial film pattern 144" is removed.

In some implementation, the plasma process may be carried out using gas (e.g., $O_2$, $N_2$, $H_2$, CO, $CO_2$, or $CH_4$) including at least one of oxygen, nitrogen, or hydrogen.

If an $O_2$ plasma process is used, oxygen radicals (O*) may flow into the sacrificial film pattern 144" through the first capping film 148a, and the oxygen radicals (O*) included in the sacrificial film pattern 144" may be combined with carbons of the sacrificial film pattern 144", resulting in formation of CO or $CO_2$. The formed CO or $CO_2$ may be discharged outside through the first capping film 148a. As a result, the sacrificial film pattern 144" may be removed, and the air layer 144 may be formed at the position from which the sacrificial film pattern 144" is removed.

The first capping film 148a having a thin thickness may be collapsed in the subsequent process of removing the sacrificial film pattern 144". Therefore, in order to prevent collapse of the first capping film 148a irrespective of etching of the sacrificial film pattern 144", the support film 146 may be formed over the sacrificial film 144", and the plasma process may be carried out thereupon.

Subsequently, one second capping film 148b may be formed over the first capping film 148a, and the other second capping film 121b may be formed over the first capping film 121a, resulting in formation of the grid structure 140.

In some implementations, the first capping film 148a or 121a is formed to be thin enough to remove the sacrificial film pattern 144" by the above-mentioned plasma process, forming the air layer 144. Therefore, the first capping film 148a or 121a based on some embodiments may be formed as thin as possible.

In some cases, the first capping film 148a alone may be structurally weak, and thus there is a chance for collapse in a subsequent thermal annealing process or other processes. Therefore, in some embodiments of the disclosed technology, the second capping film 148b and 121b may be additionally formed over the first capping film 148a and 121a after completion of the plasma process. As shown in FIG. 5C, capping films 148 and 121 may include the first and second capping films.

Figure 5D:
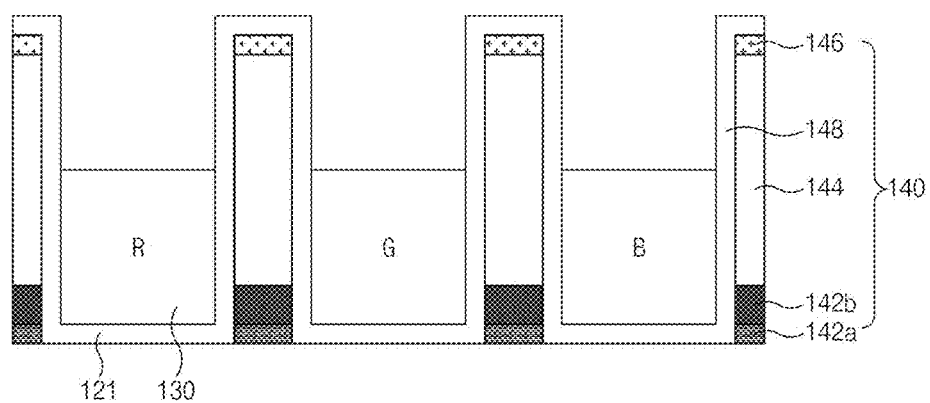

Referring to FIG. 5D, the color filter materials may be formed to fill each gap between the grid structures 140, and some parts of the color filter materials may be etched, so that the color filter layers 130 may be formed between the grid structures 140. The color filter materials may be partially removed or etched through $O_2$ descum process processing.

In this case, each color filter layer 130 may be etched to a height corresponding to ⅔ of the height of each grid structure 140. That is, the color filter layer 130 is not formed at the upper region of the gap between the grid structures 140.

Figure 5E:
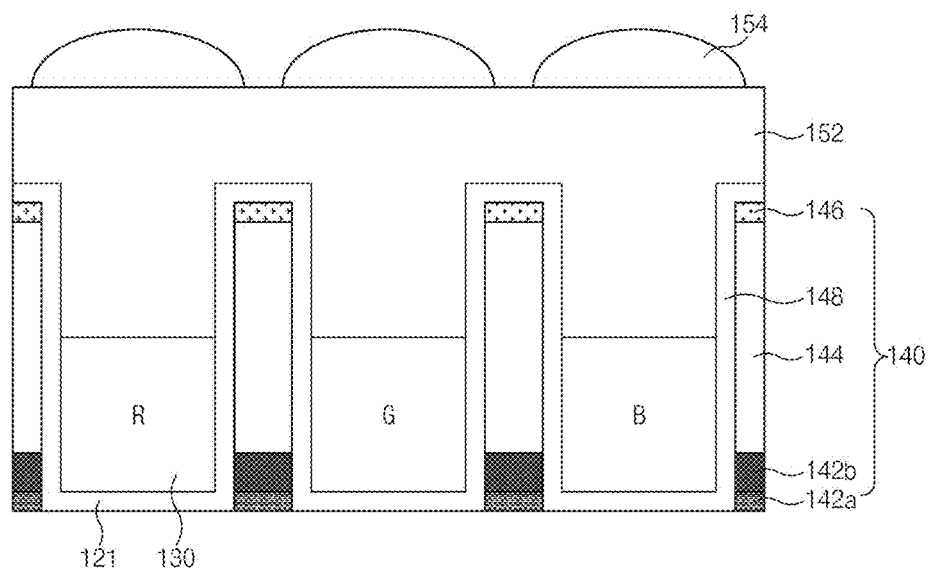

Referring to FIG. 5E, a lens material film 152 may be formed over the color filter layers 130 and the grid structures 140, so that each gap between the grid structures 140 can be filled with the lens material film 152.

The lens material layer 152 may include polyimide-based resin in which microparticles (e.g., nanoparticles) having high-refractive-index are evenly dispersed in the polymer. Alternatively, the lens material layer 152 may include a material layer formed of a mixture of high-refractive-index material particles and a resin.

In some embodiments of the disclosed technology, the high-refractive-index material may include at least one of high-refractive-index metal oxide materials such as titanium oxide ($TiO_2$), tantalum oxide (e.g., $TaO_2$ or $Ta_2O_5$), zirconium oxide ($ZrO_2$), zinc oxide (ZnO), tin oxide (SnO), aluminum oxide ($Al_2O_3$), lanthanum oxide ($La_2O_3$), cesium oxide ($CeO_2$), and yttrium oxide ($Y_2O_3$).

Subsequently, microlenses 154 corresponding to respective unit pixels may be formed over the lens material film 152. For example, the microlenses 154 may be formed over the lens material film 152 while being spaced apart from each other at intervals of the same distance as the distance between the color filters.

Figure 5F:
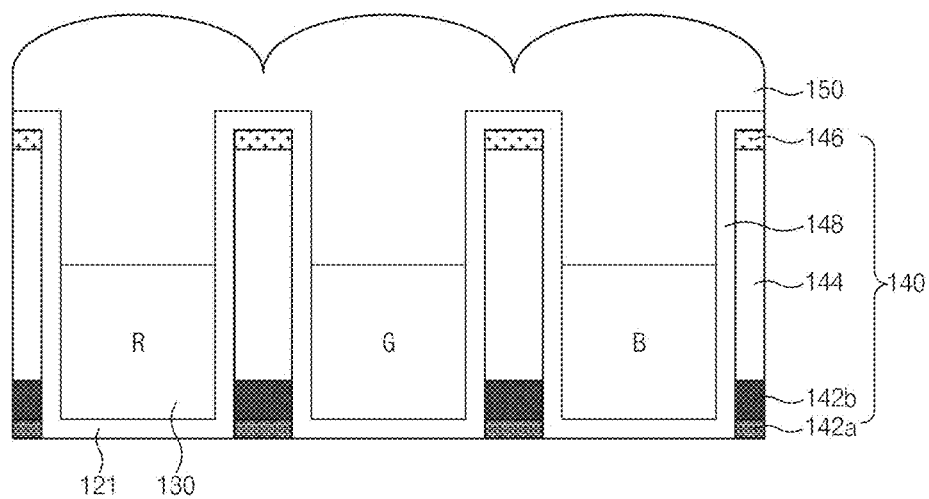

Referring to FIG. 5F, after the lens material film 152 is first etched using the micro lenses 154 as an etch mask, the residual microlenses 154 may be removed, resulting in formation of the lens layer 150.

Figure 6:
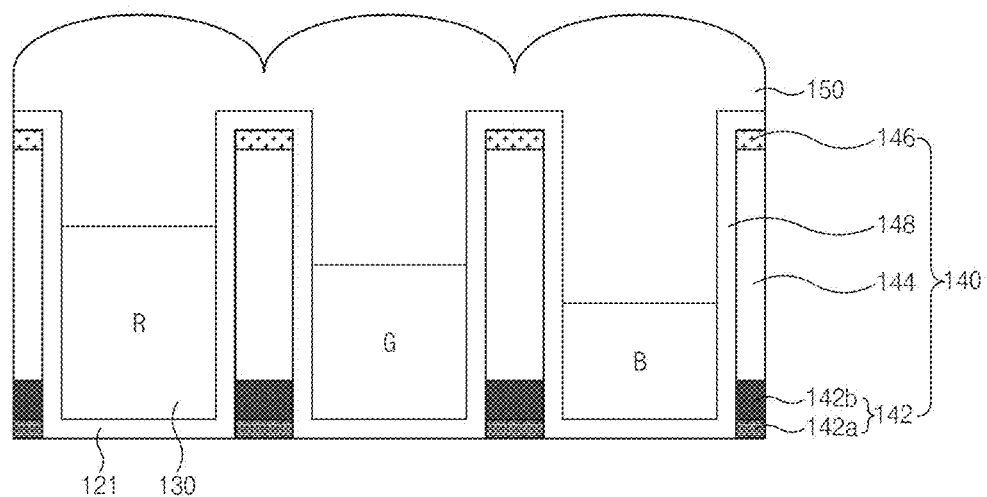
FIG. 6 is an example of a cross-sectional view illustrating a grid structure, color filter layers, and a lens layer shown in FIG. 2.

FIG. 6 is an example of cross-sectional view illustrating a grid structure, color filter layers, and a lens layer shown in FIG. 2.

Referring to FIG. 6, the respective color filter layers (R, G, B) of the color filter layer 130 may have different heights according to wavelengths of the corresponding colors.

For example, the green filter (G) may be formed at a higher location than the blue filter (B), and the red filter (R) may be formed at a higher location than the green filter (G)

As is apparent from the above description, the image sensing device implemented based on some embodiments of the disclosed technology can effectively prevent occurrence of crosstalk between neighboring pixels.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that various other modifications and embodiments can be devised by those skilled in the art that will fall within the spirit and scope of the principles of this disclosure. Particularly, various variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
    a substrate layer in which an array of photoelectric conversion elements is formed;
    grid structures disposed over the substrate layer to divide space above the substrate into different sensing regions, each grid structure including an air layer;
    color filters formed to fill bottom portions of spaces between adjacent air layers of the grid structures and in contact with the adjacent grid structures, the color filters having a higher refractive index than the air layer; and
    a lens layer disposed over the grid structures and the color filters such that part of the lens layer fills top portions of the spaces between the air layers of the grid structures, the lens layer having a higher refractive index than the color filters.

2. The image sensing device according to claim 1, wherein:
    a top surface of the grid structures is formed to protrude upward from top surfaces of the color filters.

3. The image sensing device according to claim 1, wherein:
    a lower portion of the lens layer is formed between the air layers.

4. The image sensing device according to claim 1, wherein the lens layer includes:
    a polyimide-based resin in which microparticles having high-refractive-index materials are dispersed in a polymer.

5. The image sensing device according to claim 4, wherein the high-refractive-index materials include:
    at least one of titanium oxide ($TiO_2$), tantalum oxide ($TaO_2$, $Ta_2O_5$), zirconium oxide ($ZrO_2$), zinc oxide (ZnO), tin oxide (SnO), aluminum oxide ($Al_2O_3$), lanthanum oxide ($La_2O_3$), cesium oxide ($CeO_2$), or yttrium oxide ($Y_2O_3$).

6. The image sensing device according to claim 1, wherein the lens layer includes:
    a material layer including a mixture of high-refractive-index material particles and a resin.

7. The image sensing device according to claim 6, wherein the high-refractive-index materials include:
    at least one of titanium oxide ($TiO_2$), tantalum oxide ($TaO_2$, $Ta_2O_5$), zirconium oxide ($ZrO_2$), zinc oxide (ZnO), tin oxide (SnO), aluminum oxide ($Al_2O_3$), lanthanum oxide ($La_2O_3$), cesium oxide ($CeO_2$), or yttrium oxide ($Y_2O_3$).

8. The image sensing device according to claim 1, wherein the refractive index of the color filters is higher than 1 and is equal to or less than 1.6.

9. The image sensing device according to claim 1, wherein each of the grid structures further includes:
    a metal layer disposed below the air layer;
    a support film disposed over the air layer; and
    a capping film for covering the metal layer, the air layer, and the support film.

10. The image sensing device according to claim 9, wherein the support film includes:
    at least one of a silicon oxide nitride film ($Si_xO_yN_z$, where each of 'x', 'y', and 'z' is a natural number), a silicon oxide film ($Si_xO_y$, where each of 'x' and 'y' is a natural number), or a silicon nitride film ($Si_xN_y$, where each of 'x' and 'y' is a natural number).

11. The image sensing device according to claim 9, wherein the capping film includes:
    a first capping film for capping the metal layer, the air layer, and the support film; and
    a second capping film formed over the first capping film.

12. The image sensing device according to claim 11, wherein the first capping film includes an ultra low temperature oxide (ULTO) film.

13. The image sensing device according to claim 9, wherein the capping film is formed to extend to a lower portion of the color filters.

14. The image sensing device according to claim 1, wherein the color filters are formed to have different heights according to respective colors.

* * * * *